(12) United States Patent
Sander et al.

(10) Patent No.: US 7,095,353 B2
(45) Date of Patent: Aug. 22, 2006

(54) FREQUENCY TO DIGITAL CONVERSION

(75) Inventors: Wendell Sander, Los Gatos, CA (US); Stephan V. Schell, San Mateo, CA (US); Matthew Mow, Saratoga, CA (US)

(73) Assignee: Amalfi Semiconductor Corporation, Los Gatos, CA (US)

( * ) Notice: Subject to any disclaimer, the term of this patent is extended or adjusted under 35 U.S.C. 154(b) by 139 days.

(21) Appl. No.: 10/997,058

(22) Filed: Nov. 23, 2004

(65) Prior Publication Data

US 2006/0109147 A1 May 25, 2006

(51) Int. Cl.
*H03M 1/60* (2006.01)
*H04L 7/00* (2006.01)

(52) U.S. Cl. .............................. 341/157; 327/3; 327/45; 327/48; 327/113; 327/117; 327/144; 327/151; 375/354; 375/355; 375/360; 375/369; 375/371; 375/373; 375/375

(58) Field of Classification Search .................... 327/3, 327/45, 48, 113, 115, 117, 144, 145, 151; 341/157; 375/354–355, 360, 369, 371, 373, 375/375

See application file for complete search history.

(56) References Cited

U.S. PATENT DOCUMENTS

| | | | | |
|---|---|---|---|---|
| 4,303,983 | A | * | 12/1981 | Chaborski .................... 702/176 |
| 5,047,967 | A | | 9/1991 | Sander et al. |
| 5,619,148 | A | * | 4/1997 | Guo ................................ 327/3 |
| 6,198,347 | B1 | | 3/2001 | Sander et al. |
| 6,219,394 | B1 | | 4/2001 | Sander |
| 6,269,135 | B1 | | 7/2001 | Sander |
| 6,301,318 | B1 | * | 10/2001 | Wei et al. .................... 375/371 |
| 6,366,145 | B1 | * | 4/2002 | Williams et al. ............. 327/156 |
| 6,861,886 | B1 | * | 3/2005 | Ludden et al. ............... 327/156 |
| 2003/0095619 | A1 | * | 5/2003 | Vallet et al. ................. 375/355 |

OTHER PUBLICATIONS

Walter T. Bax, Miles A. Copeland; *A GMSK Modulator Using a ΔΣ Frequency Discriminator-Based Synthesizer*; IEEE Journal of Solid-State Circuits, pp. 1218-1227, vol. 36. No. 8. Aug. 2001.
Walt T. Bax, Tom A.D. Riley, Calvin Plett, Miles A. Copeland; *A Σ•Δ Frequency Discriminator Based Synthesizer*; 1995 IEEE International Symposium on Circuits and Systems Seattle, Washington, USA Apr. 30-May 3, 1995. pp 1-4.

(Continued)

*Primary Examiner*—Peguy JeanPierre
*Assistant Examiner*—Khai M. Nguyen
(74) *Attorney, Agent, or Firm*—Van Pelt, Yi & James LLP (57) ABSTRACT

A technique of processing an input signal having an input signal phase is disclosed. The technique includes determining a number of transitions of the input signal within a period having a start and an end. The technique includes determining a relative beginning phase of the input signal at the start of the period, which includes generating a first reference signal having a first reference signal frequency and a first reference signal phase synchronized with the start of the period, and detecting a first time interval required for the input signal phase to have a first specified relationship to the first reference signal phase. The technique includes similarly determining a relative ending phase of the input signal at the end of the period. The technique includes determining an input signal temporal characteristic from the number of transitions and the relative beginning phase and the relative ending phase.

42 Claims, 7 Drawing Sheets

OTHER PUBLICATIONS

Ian Galton; *Analog-Input Digital Phase-Locked Loops for Precise Frequency and Phase Demodulation*; IEEE Transactions on Circuits and Systems-II: Analog and Digital Signal Processing, pp. 621-630, vol. 42, No. 10, Oct. 1995.

Ian Galton; William Huff; Paolo Carbone, Eric Siragusa; *A Delta-Sigma PLL for 14-b, 50 kSample/s Frequency-to-Digital Conversion of a 10 MHz FM Signal*; IEEE Journal of Solid-State Circuits, pp. 2042-2053, vol. 33, No. 12, Dec. 1998.

Mats Høvin, Alf Olsen, Tor Sverre Lande, Chris Toumazou; *Delta-Sigma Modulators Using Frequency-Modulated Intermediate Values*; IEEE Journal of Solid-State Circuits, pp. 13-22, vol. 32, No. 1, Jan. 1997.

M. Høvin, S. Kiaei, T.S. Lande; Σ—Δ *Frequency-to-Time Conversion by Triangularly Weighted ZC Counter*; International Symposium on Low Power Electronics and Design, Proceedings of the 1997 International Symposium on Low Power Electronics and Design, Monterey, California, United States, pp. 52-55, 1997.

M. Rakhmanov, M. Evans, H. Yamamoto; *Optical Vernier Technique for In-Situ Measurement of the Length of Long Fabry-Perot Cavities*; LIGO-T970174-02. Oct. 15, 1997. pp 1-10.

N. Ramalingam, V.K. Varadan, V.V. Varadan; *Innovative Frequency Measurement Technique Used In the Design of a Single Channel Frequency to Digital Converter ASIC*; [Abstract only] http://stacks.iop.org/0964_-1726/8/243. 1 page.

Robert Bogdan Staszewski, Chih-Ming Hung, Ken Maggio, John Wallberg, Dirk Leipold, Poras T. Balsara; *All-Digital Phase-Domain TX Frequency Synthesizer For Bluetooth Radios In 0.13 βm CMOS*; ISSCC 2004/Session15/Wireless Consumer ICs/ 15.3; 2004 IEEE International Solid-State Circuits Conference; Feb. 2004. 10 pages.

Wendell B. Sander, Stephan V. Schell, Brian L. Sander, *Polar Modulator for Multi-mode Cell Phones*, http://www.tropian.com/tech/papers_main.html 7 pages—unknown date.

*Vernier Caliper*, http://www.physics.smu.edu/~scalise/apparatus/caliper/ Mar. 10, 2005 (printout date) 1 page.

\* cited by examiner

PRIOR ART

FREQUENCY TO DIGITAL CONVERSION

FIELD OF THE INVENTION

The present invention relates generally to signal processing. More specifically, a frequency to digital converter is disclosed. Because of the duality between frequency and time, the invention may also be used as a time digitizer.

BACKGROUND OF THE INVENTION

Figure 1:
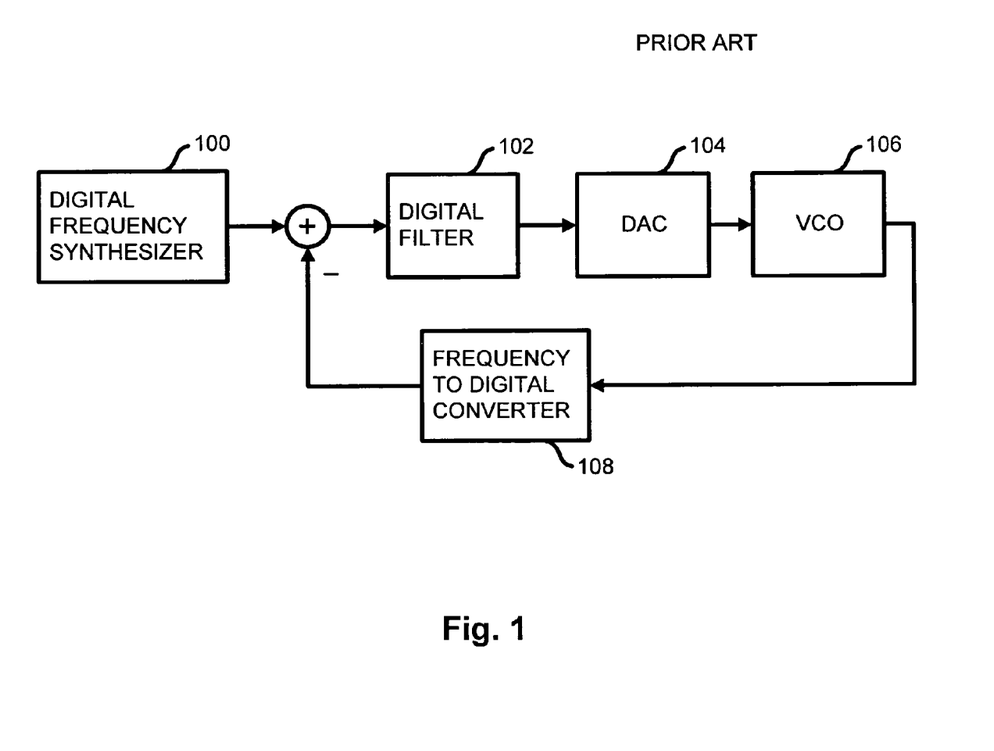
FIG. 1 is a block diagram illustrating a typical frequency locked loop.

Frequency to digital converters and time to digital converters are useful in a number of signal processing applications. For example, frequency to digital converters are commonly used in frequency locked loops and can be used in phase locked loops. FIG. 1 is a block diagram illustrating a typical frequency locked loop. The output of a digital frequency synthesizer 100 and the output of a frequency to digital converter 108 are differenced and passed to a digital filter 102. The output of the digital filter goes to a digital to analog converter (DAC) 104. The output of the DAC is passed to a voltage controlled oscillator (VCO) 106, which outputs an analog output signal. The feedback loop is completed when the analog output of the VCO is passed to the frequency to digital converter.

Figure 2:
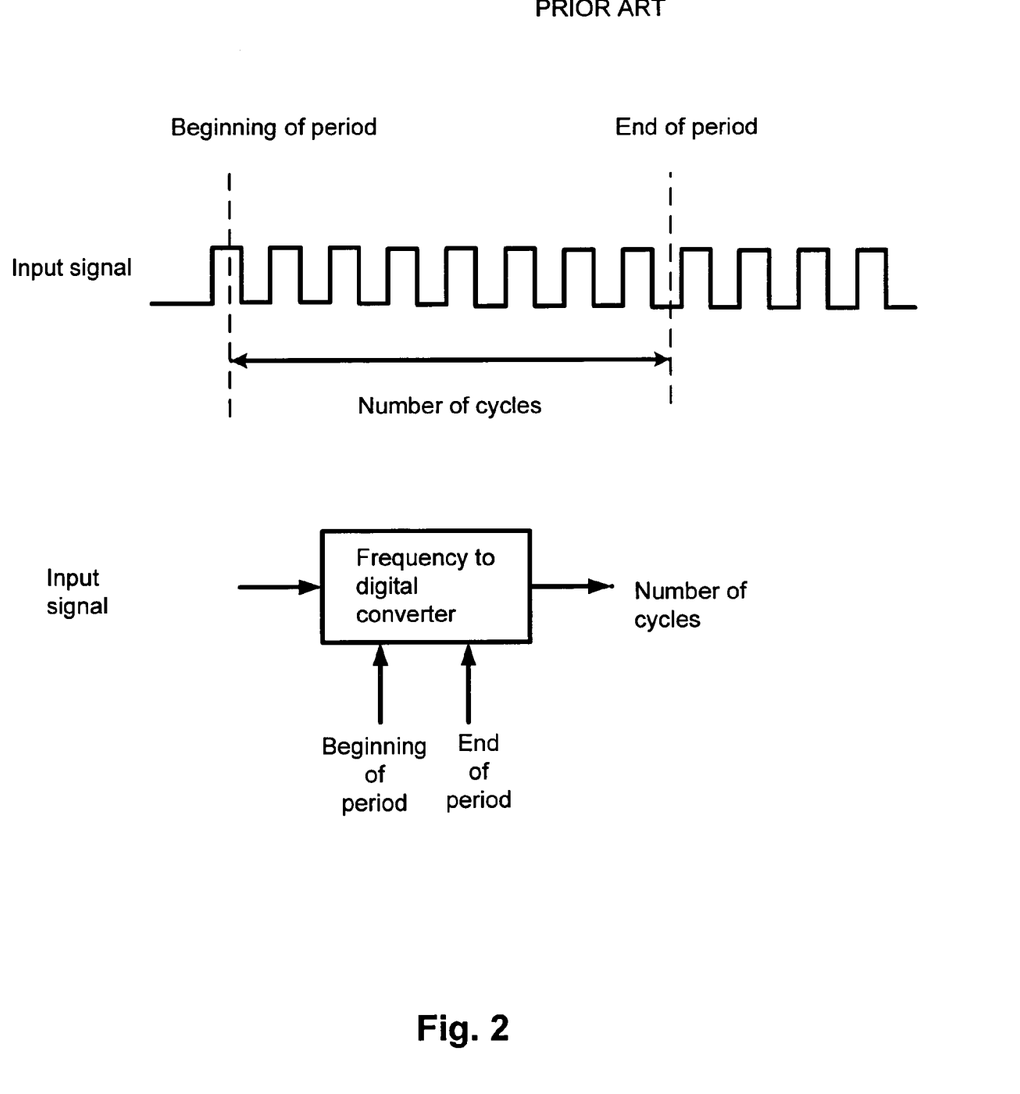
FIG. 2 is a diagram illustrating the functional behavior of a typical frequency to digital converter.

FIG. 2 is a diagram illustrating the functional behavior of a typical frequency to digital converter. The frequency to digital converter determines cycles per period and can be employed in a number of systems. Sometimes the number of cycles that occur in a period is fractional. The ability to determine the fractional number determines the resolution of the frequency to digital converter. Improving the resolution of the frequency to digital converter improves the performance of various systems that incorporate the frequency to digital converter, such as the frequency locked loop shown above. Attempts to improve the resolution include using a chain of inverters to generate additional oscillations for each cycle and counting the additional oscillations to determine the fractional number. However, this approach may be affected by process variation in semiconductor fabrication, and resolution may be limited by propagation time in the inverter chain. It would be useful if other techniques could be developed to more accurately perform frequency to digital conversion.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Frequency to digital conversion using a reference signal to measure another signal's number of cycles is disclosed, where this number may comprise an integer part and a fractional part. Because of the duality between time and frequency, techniques for frequency to digital conversion may also be used for time to digital conversion. For the purpose of clarity, the following description refers to frequency to digital conversion. The techniques are also applied to time to digital conversion in other embodiments. In various embodiments, frequency to digital conversion is accomplished by determining a number of cycles that occur for a signal during a defined period of time. In general, there may be an integer plus a fractional number of cycles occurring in the period. Precise determination of the frequency of the signal requires determination of both the integer and fractional number of cycles. In some embodiments, the integer and fractional number of cycles are determined separately and then summed. The integer number of cycles is determined by counting the number of input signal transitions over the period. The fractional number of cycles is determined by comparing the phase of the input signal at the beginning and the end of the period. The phase of the input signal at the beginning and end of the period are measured using a reference signal. The integer number of cycles may also be determined by estimating or some variation of counting. In some embodiments, an integer and fractional number of input signal cycles are determined together at the beginning and end of the period and subtracted. A reference signal is used to determine the integer and fractional numbers.

Figure 3:
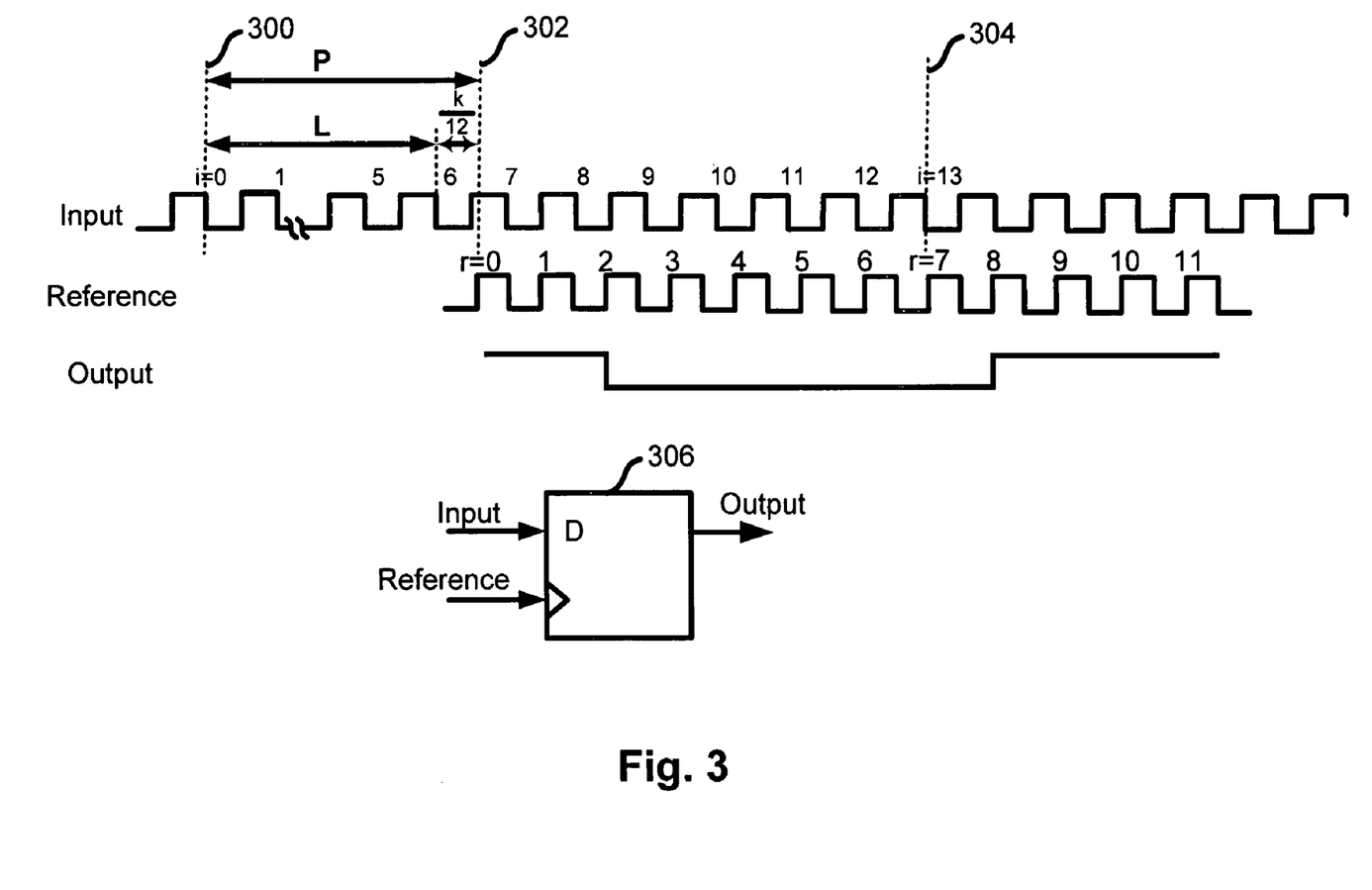
FIG. 3 is a timing diagram illustrating a method of measuring phase using a reference signal.

FIG. 3 is a timing diagram illustrating a method of measuring phase using a reference signal. In the example shown, the frequency of the reference signal has been selected so that 11 input signal cycles are approximately equal to 12 reference signal cycles. In general, I input signal cycles equals R reference signal cycles and it is preferable that R and I are relatively prime. A start of the period 300 and an end of the period 302 define the period of interest, P. The resolution of the measurement can be adjusted by changing the ratio of the reference signal frequency to the input signal frequency.

The integer number of input signal cycles, L, can readily be obtained over the period of interest. In this example, L=6. There are a variety of methods to determine the integer number of cycles, for example: counting, guessing, or estimating.

Some portion of the period is not accounted for by this integer value. This fractional portion is defined as k/12. In this example, the input signal is phase synchronous with the start of the period 300 for the purpose of illustration. Generally, the input signal may be free running and not phase synchronous with the start of the period. The relationship of the input signal phase to the start of the period may be known and asynchronous, or even unknown. The fractional portion of the period is determined by comparing the phase of the input signal at the beginning and at the end of the period. In some embodiments, other techniques may be used to further resolve the fractional portion.

In this example, the input signal is phase synchronous with the start of the period, so the fractional portion of the period is equal to the phase of the input signal at the end of the period. The reference signal is started at the end of the period phase synchronous to the end of the period 302. The input signal becomes phase aligned with the reference signal at 304 because of the frequency relationship between the two signals. In general, it may be determined that the phase of the input signal and the phase of the reference signal satisfy some specified relationship. In this example, the specified relationship is that the two signals are aligned and have a simultaneous rising edge. If the two signals are not exactly aligned then the reference signal rising edge closest to an input signal rising edge within 12 reference signal cycles after the end of the period is selected. Alternatively, alignment is detected on the last rising edge of the reference signal for which the input signal's level is low (i.e., the last rising edge of the reference for which the Output signal is still low).

If alignment 304 is detected and the point at which it occurs is found, then the fractional remainder k/12 can be determined from this information. Preferably, the frequencies of the input signal and the reference signal are relatively prime to facilitate this determination. Equations 1 and 2 are defined by the phase alignment of the input signal and the reference signal at 304. The first expresses the number of input signal cycles at alignment 304 as the sum of the period and the number of reference signal cycles at alignment 304 after a conversion of units. The second expresses the same value as the sum of the integer number of input signal cycles, the fractional number of input signal cycles, and the number of reference signal cycles at alignment 304 after a conversion of units.

$$i = P + r*(11/12) \quad \text{Equation 1}$$

$$i = (L + k/12) + r*(11/12) \quad \text{Equation 2}$$

P, i, L and k are in units of input signal cycles and r is in units of reference signal cycles. i and r are the respective cycle numbers at which alignment 304 occurred. If L, i, r and k are integers and because 11 and 12 are relatively prime, then k=r and Equations 1 and 2 reduce to:

$$P = L + r/12 \quad \text{Equation 3}$$

Therefore, with the number of reference signal cycles it took for alignment, the fractional portion r/12 may be calculated. Each reference signal cycle before alignment corresponds to an additional $1/12^{th}$ input signal cycle in the measurement. That is, if alignment occurs after the first reference signal cycle (r=1), then the fractional portion is $1/12^{th}$, if alignment occurs after the second reference signal cycle (r=2), then the fractional portion is $2/12^{th}$, etc. In the example, P=6 7/12 because there were 6 integer input signal cycles and the fractional portion is 7/12 because alignment occurred after 7 reference signal cycles.

Equation 3 can be generalized for different frequency ratios and illustrates that changing the ratio of the input and reference frequencies affects the resolution of the fractional measurement. As a result, the number of input signal cycles over the period (and the frequency) may be determined with much greater precision than if only integer number of cycles were counted.

If the input signal is not phase synchronous with the start of the period, then the input phase at the start of the period is accounted for. This may be done by determining the beginning input phase at the start of the period and then subtracting this value from the integer portion and the end input phase at the end of the period. The integer portion and end input phase are determined as if the input signal is phase synchronous with the start of the period. The beginning input phase is determined by the same method described above, but a fractional value is of interest here. The input signal is k'/12 through a cycle when the start of the period occurs. A period P' of duration k'/12 is defined adjacent to the period to be measured. k'/12 and P' are defined such that the input signal is phase synchronous with the start of P' and P'=k'/12. As described above, alignment of the input signal and a reference signal determine this fractional value k'/12. A reference signal, having the same frequency as described above, is started phase synchronous with the end of P'. Alignment is detected some time afterwards and the number of reference signal cycles required for alignment is used to determine k'/12 from Equation 3. With the beginning input phase known, this value can be subtracted from the integer portion and end input phase. Thus, the method may be applied twice to measure a period even if the input signal is not phase synchronous with the start of the period.

FIG. 3 illustrates a flip flop 306 used to detect the alignment between the input signal and the reference signal. The input signal is sampled by the flip flop on the rising edge of every reference signal. Other embodiments perform detection using different circuits. A change in the output sequence of the flip flop from low to high indicates alignment. In this example, such a transition in the output sequence occurs on the $7^{th}$ cycle of the reference signal and the change in the output sequence is from logically false to logically true. Detection of the alignment point enables a determination of the number of reference signal cycles required for alignment, which is used to calculate the fractional number of cycles.

In some cases, it may not be desirable to operate a flip flop at a frequency required by an application. Power dissipation and the maximum operating frequency of a flip flop may be issues at the input or reference frequencies of interest. By replacing the input or reference signal with multiple subsignals, it is possible to detect alignment and measure the period using subsignals of lower frequency than the original input or reference signal.

Figure 4:
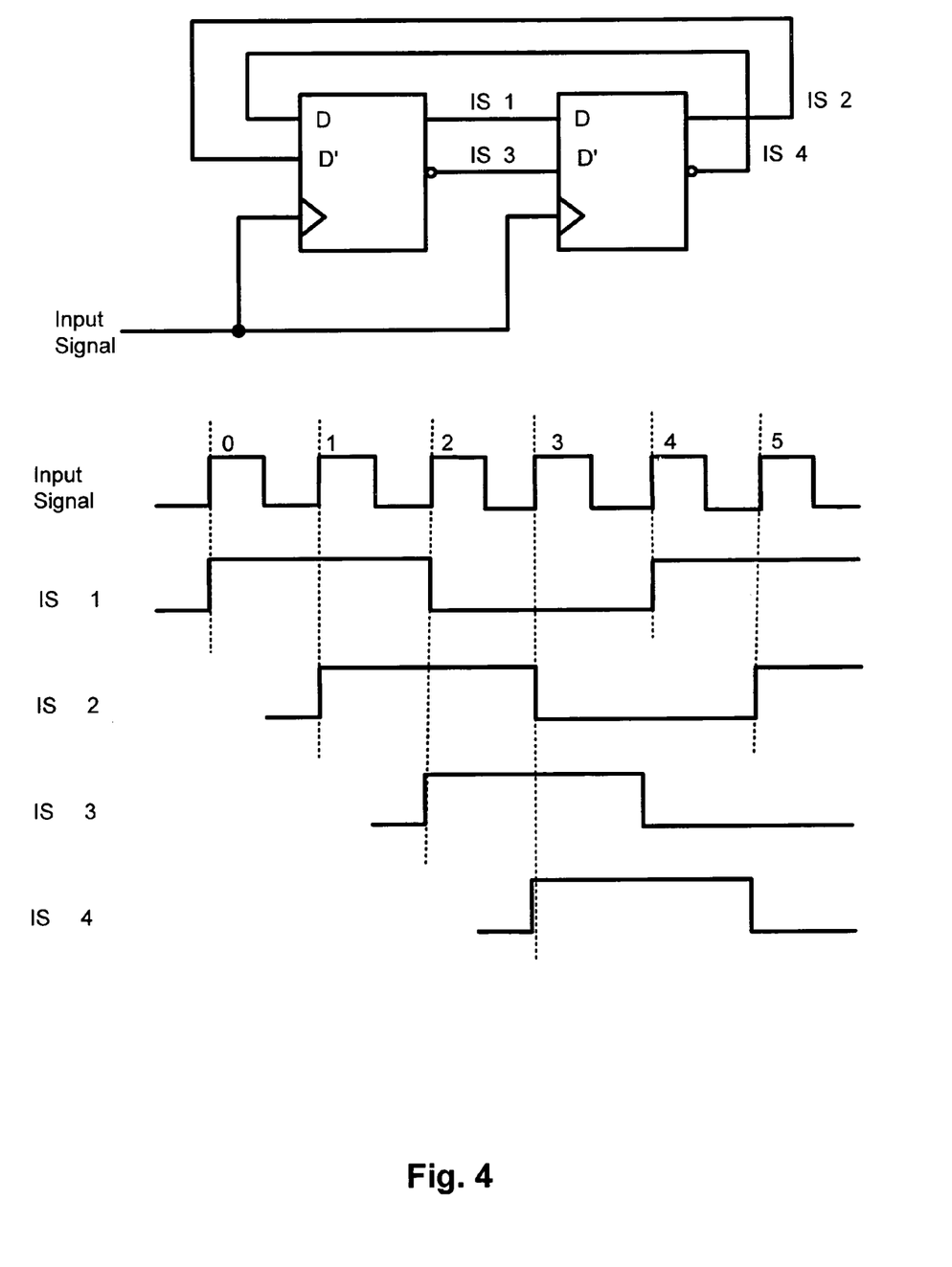
FIG. 4 is a diagram illustrating the input subsignals generated by a Johnson Counter, although any method of generating the desired 4 subsignals may be used, such as a quadrature divider.

Various circuits can generate the input and reference subsignals. FIG. 4 is a diagram illustrating the input subsignals generated by a Johnson Counter, although any method of generating the desired 4 subsignals may be used, such as a quadrature divider. In this embodiment, the input signal drives a Johnson Counter which in turn generates the 4 input subsignals: IS1, IS2, IS3 and IS4. The subsignals are all $1/4^{th}$ the frequency of the original input signal and are $1/4^{th}$ of a cycle out of phase with respect to each other. With the 4 input subsignals it is possible to completely reconstruct the original input signal. The first rising edge of the input signal corresponds to the rising edge of IS1, the second rising edge to the rising edge of IS2, etc. The same information is therefore conveyed by the subsignals but they are more convenient to work with because of their lower frequency.

Figure 5:
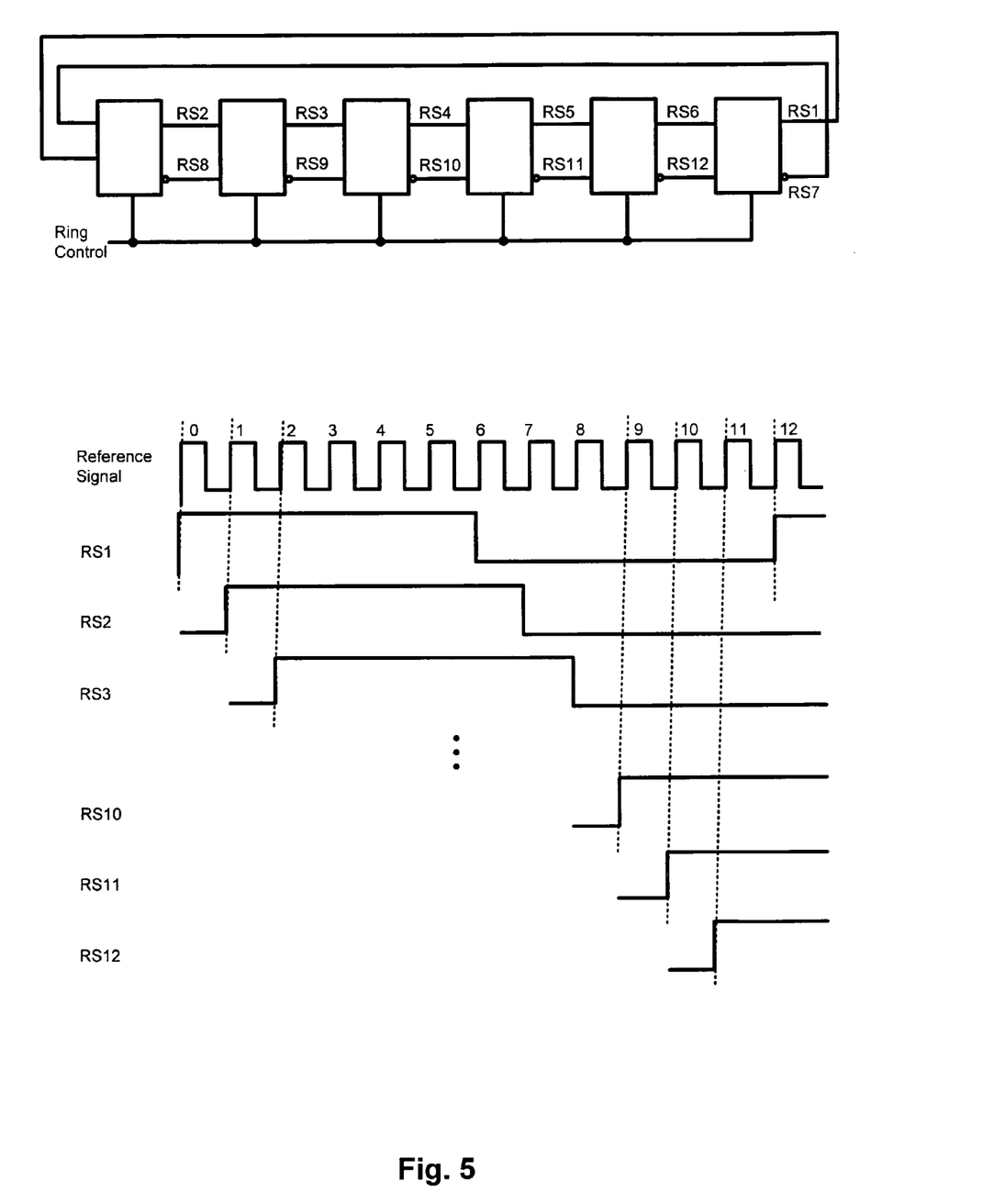
FIG. 5 is a diagram illustrating the reference subsignals generated by a ring oscillator.

FIG. 5 is a diagram illustrating the reference subsignals generated by a ring oscillator. Similar to the input subsignals, multiple reference subsignals of lower frequency replace the reference signal. In this embodiment, subsignals RS1 through RS12 are generated by the ring oscillator at $1/12^{th}$ the frequency of the original reference signal. The phases of the subsignals are $1/12^{th}$ of a cycle out of phase with respect to each other. Preferably, the number of reference subsignals is an integer multiple of the number of input subsignals and is equal to R, where I input signal cycles equals R reference signal cycles. The signal Ring Control starts and stops the ring oscillator. To maintain the phase synchronous relationship between the original reference signal and the end of the period, subsignal RS1 is phase synchronous with the end of the period. At the end of the period, the Ring Control signal is used to start the ring oscillator. The ring oscillator stops generating the reference subsignals after alignment is detected, again using the Ring Control signal. Other embodiments use different circuit or subsignals.

No reference signal is shown in the circuit diagram of FIG. 5. The reference signal is in the timing diagram merely for conceptual purposes. Unlike the Johnson Counter, the ring oscillator does not directly derive its subsignals from the original signal. To ensure the ring oscillator generates subsignals with the correct frequencies, the delays through the ring oscillator are tunable. Tuning the ring oscillator is described in detail below. The delays are adjusted so that the subsignals are $1/11^{th}$ the frequency of the input signal. In the example shown the original reference signal is 12/11 times faster than the input signal, and all of the reference subsignals are $1/12^{th}$ the frequency of the original reference signal. Other embodiments use different ratios.

By tuning the delays through the ring oscillator, reference subsignals at $1/11^{th}$ of the input signal frequency are generated. If the input subsignals and reference subsignals are allowed to run without stopping, multiple alignments are detected. The alignments occur (isub*TDM) reference signal cycles apart, where isub is the number of input subsignals used to replicate the input signal and TDM reference signal cycles equals TDM−1 input signal cycles. In this example, isub=4 and TDM=12 so the alignments occur every 48 reference signal cycles. An iterative process of measuring successive alignments, calculating the number of reference signal cycles between alignments and adjusting the delays tunes the ring oscillator to generate the desired reference subsignal frequencies. Although the ring oscillator remains on while being tuned, during normal measurements the ring oscillator is turned off after alignment has been detected.

As described above, in some embodiments the input signal and the reference signal are broken up into subsignals to avoid processing high frequency signals. Each rising edge in the original input or reference signal has an equivalent rising edge in one of the input or reference subsignals, respectively. In some embodiments, all of the possible combinations of input subsignal and reference subsignal rising edges are checked for alignment. In some embodiments, the amount of circuitry is reduced by checking only a subset of all possible combinations. The tradeoff for using a subset of combinations is that the amount of time to detect alignment may increase. If all possible combinations are checked, alignment is detected as soon as it occurs. Thus, alignment is detected in the same amount of time as if the original reference signal and the original input signal were checked for alignment. If only a subset is checked then the first instance of alignment may not be detected. A subsequent instance of alignment is detected and therefore the amount of time to detect alignment may increase.

Using the ring oscillator and Johnson Counter, 12 reference subsignals and 4 input subsignals are generated in this embodiment. Thus, there are 48 possible combinations and 12 of those combinations are checked in this example. In various embodiments, the subset of combinations is selected to achieve a desired tradeoff of the time to detect alignment and the amount of circuitry. In this example, reference subsignals RS 1 through RS4 are compared to input subsignals IS1 through IS4, respectively. Reference subsignals RS5 through RS8 are compared to input subsignals IS1 through IS4, respectively. Reference subsignals RS9 through RS12 are compared to input subsignals IS1 through IS4, respectively. The number of reference subsignals is an integer multiple of the number of input subsignals, so pairing and detection of alignment are simplified.

The 12 input and reference subsignal pairs are used to detect alignment and calculate the number of input signal cycles over the period. In some embodiments, a timestamp in units of input signal cycles is calculated at the beginning and end of the period, and the period is equal to the difference of the two timestamps. A reference signal (which may be implemented as multiple subsignals) is started at the beginning of the period. Alignment is subsequently detected and the time for alignment to occur is used to calculate a timestamp at the beginning of the period. At the end of the period a reference signal (or subsignals) is started. Using the time it takes for alignment to occur, a timestamp for the end of the period is calculated. The difference of the two timestamps is the period in units of $1/12^{th}$ an input signal cycle. With this method the timestamps do not need to equal the period from time 0 until the point the timestamp is taken.

A count of the number of input signal (or subsignal) cycles at alignment is used to determine the timestamp and thus the period of interest. In this embodiment, a counter that counts input subsignal IS 1 rising edges is used. Although a counter that increments on every input signal rising edge may be used, one that increments on every rising edge of input subsignal IS 1 consumes less power and requires less circuitry. This IS 1 counter is used to determine two timestamps whose values are differenced, so the counter continuously counts IS 1 across the period. If multiple, adjacent periods are measured, a free running counter is convenient. The value of the IS1 counter when the input subsignals and reference subsignals align is used to calculate the timestamp. This value at alignment is called icnt. Although the resolution of icnt will miss 0 to 3 input signal cycles at alignment, the important information in these missing cycles is captured elsewhere using the reference subsignals, described below.

To calculate the timestamp, a count of the reference signal (or subsignals) at alignment is used. As described earlier, the reference subsignals are started at the beginning and end of the period, and are stopped after each alignment. This embodiment uses a counter that counts every rising edge of RS1. A counter that increments with RS1 will consume less power and require less circuitry than one that increments every reference signal rising edge. rcnt is the value of the RS1 counter at alignment. The reference subsignals are stopped after each alignment, so the RS1 counter is reset after each alignment. rcnt is therefore the number of complete RS 1 cycles from the beginning or end of the period until alignment. Since the RS1 counter only increments with every rising edge of RS1, rcnt will miss 0 to 11 reference signal cycles. A new variable, of value 0 to 11, describes this missing count. This variable is defined to be therm and together with rcnt accurately describes the number of reference signal cycles required for alignment.

With the variables icnt, rcnt and therm, a timestamp is defined such that the difference between two timestamps is the period between them in units of $1/12^{th}$ an input signal cycle. The timestamp is defined as:

$$timestamp = 48*icnt - 132*rcnt + therm \quad \text{Equation 4}$$

The timestamp is not an absolute measure. Rather, a succession of timestamps are calculated at different times and used to determine the period between measurements. If a timestamp is calculated and recorded for the beginning of a period and again at the end of the period, the difference of the two timestamps gives the period in units of $1/12^{th}$ an input signal cycle.

Equation 4 can be generalized for other subsignal and frequency implementations. The variable TDM is defined such that (TDM-1)/TDM equals the ratio of input signal cycles to reference signal cycles. Preferably, TDM and TDM-1 are relatively prime. isub and rsub are the integer numbers of subsignals to replicate the input and reference signals, respectively. In general:

$$timestamp = isub*TDM*icnt - rsub*(TDM-1)*rcnt + therm \quad \text{Equation 5}$$

As stated above, the timestamp is not an absolute measure of anything. Timestamps are differenced to determine the period between two timestamps. The difference between timestamps, Δtimestamp, is equal to the period and the previous equations may be modified to produce Δtimestamp. Going back to Equation 5, the second and third terms of the equation are redefined as rstamp:

$$timestamp = isub*TDM*icnt - rstamp \quad \text{Equation 6}$$

where $$rstamp = rsub*(TDM-1)*rcnt - therm \quad \text{Equation 7}$$

Equation 5 is broken up into two parts which are described by Equations 6 and 7. The timestamp taken at the end of the period minus the timestamp taken at the beginning of the period is equal to the period. Equation 6 is therefore used twice: once at the beginning of the period and once at the end of the period. These two evaluations of Equation 6 are subtracted from each other, obtaining:

$$\Delta timestamp = isub*TDM*\Delta icnt - \Delta rstamp \quad \text{Equation 8}$$

Similarly, the difference of two evaluations of Equation 7 at the beginning and the end of the period give Δrstamp:

$$\Delta rstamp = rsub*(TDM-1)*(rcnt_2 - rcnt_1) - (therm_2 - therm_1) \quad \text{Equation 9}$$

$rcnt_1$ and $therm_1$ correspond to the beginning of the period and $rcnt_2$ and $therm_2$ to the end of the period. Therefore, with icnt, rcnt and therm for alignment at the beginning and end of the period, Δtimestamp (the period in $1/12^{th}$ input signal cycles) is calculated.

Figure 6A:
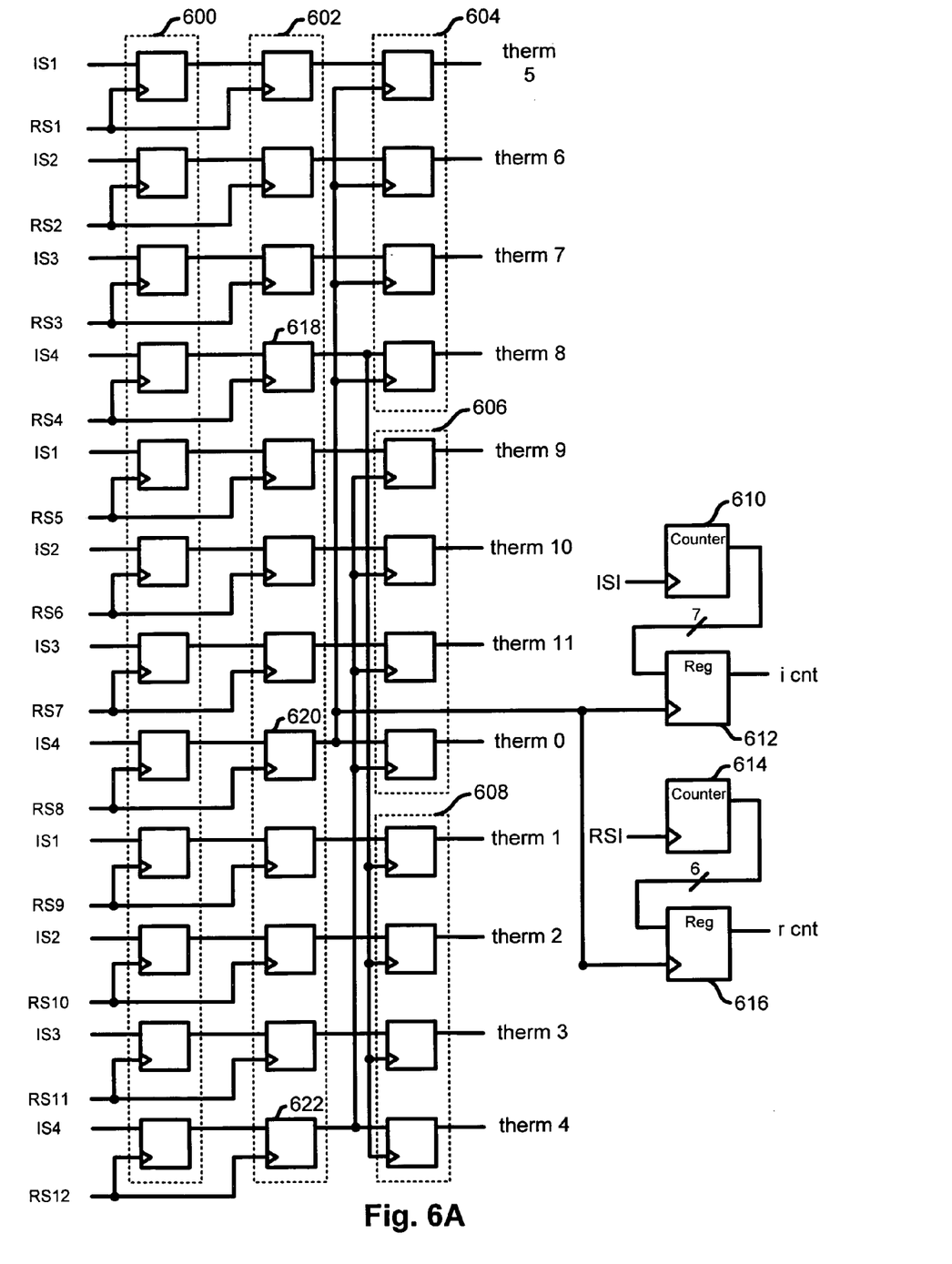
FIG. 6A is a diagram illustrating a circuit that generates data used to calculate Δtimestamp.

FIG. 6A is a diagram illustrating a circuit that generates data used to calculate Δtimestamp. The circuit counts icnt and rcnt and generates data for the detection and determination of the therm value. With icnt, rcnt and the therm values, Δtimestamp is calculated using Equations 8 and 9. The first stage of registers 600 checks input subsignals with their respective reference subsignal. To minimize metastability issues, the second stage of registers 602 captures the outputs of the first stage using the same reference subsignal. The third stage of registers is divided up into three groups based on capture time. A rising edge on register 618, 620 and 622 will trigger groups of registers 608, 604 and 606, respectively. While the first stage 600 and second stage 602 may trigger more than once in the process of detecting alignment, the third stage of registers only triggers when alignment is detected. The third stage provides timing margin as well as data before and after the alignment for error detection and correction algorithms. Counters 610 and 614 increment with each rising edge of IS1 and RS 1, respectively. A second stage of registers 612 and 616 allow the output of the counters to settle and only update icnt and rcnt once an alignment is detected.

Figure 6B:
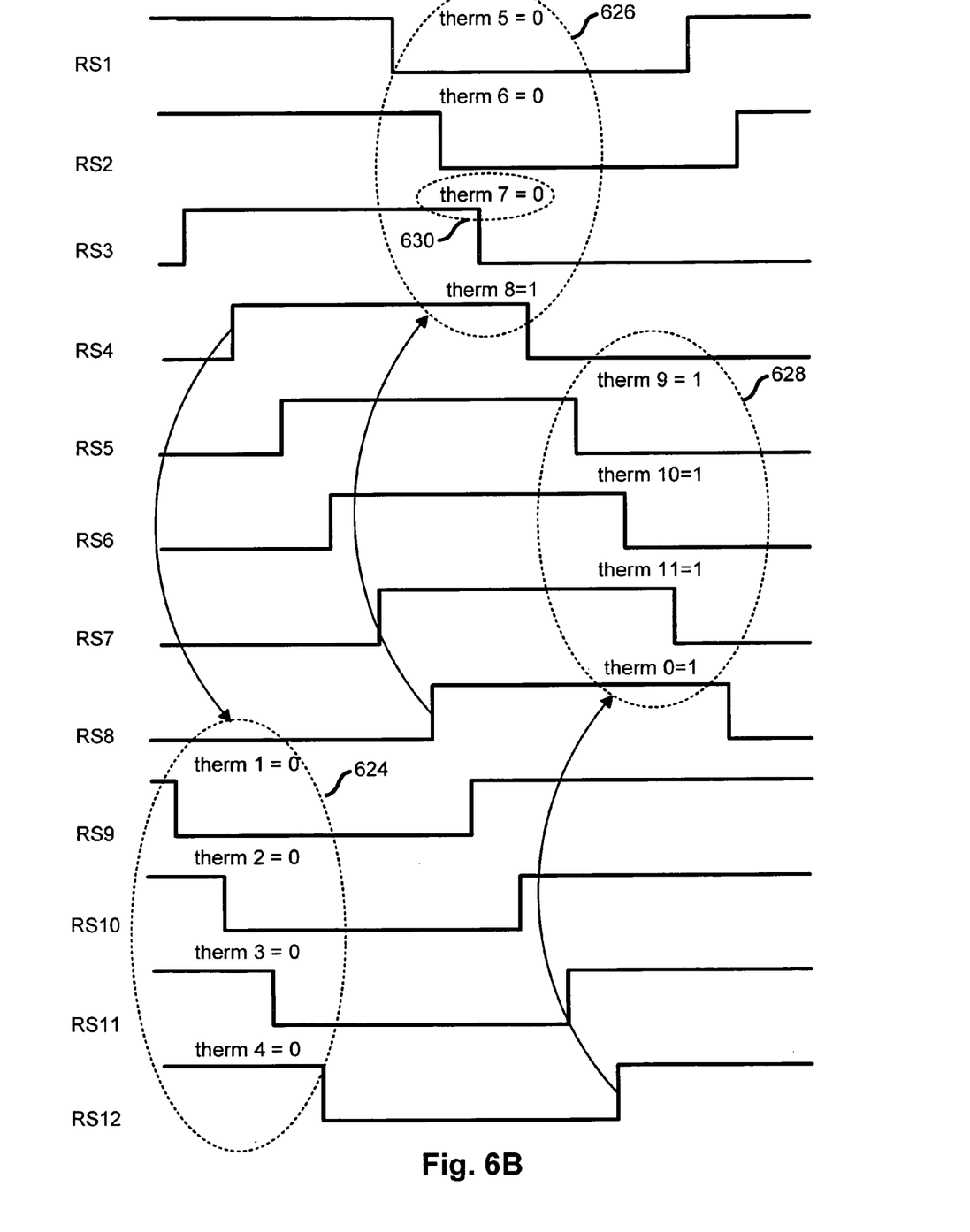
FIG. 6B is a timing diagram illustrating determination of the therm value.

FIG. 6B is a timing diagram illustrating determination of the therm value. The values of therm 1 through therm4 624 correspond to the outputs of registers 608 from FIG. 6A after alignment is detected. Similarly, the values of therm5 through therm8 626 correspond to the outputs of registers 604 and the values of therm9 through therm0 628 correspond to the outputs of registers 606. A change in the sequence of therm0 through themm 1 indicates alignment. The value of therm is determined from where the change in sequence took place. After alignment is detected, registers 604, 606 and 608 will trigger and output a logically true or logically false value. In FIG. 6B there is a change in the sequence at therm7 630. This indicates that the value of therm is 7. Additional circuitry can be employed to perform this operation. therm0 through therm 11 each correspond to different values of therm and wherever the change of sequence occurs indicates the value of therm. With the values of therm, icnt and rcnt. the timestamp may be determined.

Using the value of therm to determine the period to the nearest $1/2^{th}$ input cycle is simplified because of certain values. TDM is the number of reference cycles that are of equal duration to TDM-1 input cycles. rsub is the number of reference subsignals used to replicate the original reference signal. In this example, TDM equals rsub; both of them are 12. In general, rsub and TDM can be chosen independently and need not be equal. For example, the value of rsub may be constrained by circuit implementation to be a fixed number. In contrast, TDM may be variable, such that a single implementation of the invention may use one value of TDM sometimes and different values of TDM at other times, in order to adjust the spurious responses of the frequency to digital converter. In some embodiments, this changing of TDM requires only changing the frequency of the reference signal (i.e., to maintain the relationship that TDM reference cycles are of equal duration to TDM-1 input cycles) and updating the value of a digital register in the timestamp computation logic.

Some embodiments improve detection of the alignment between the input and reference signals or subsignals. Improvements include but are not limited to: faster detection of the alignment point, avoiding potential errors, detecting errors, and correcting errors. Changes in the circuitry could increase the timing margin to avoid timing errors in the flip flops, thus reducing errors in detecting the alignment point. Examining the flip flop outputs before or after a sequence transition may identify potential errors in detection. To correct an error, a majority vote or other decision process may be applied. The improvement process may be an iterative one where, for example, a sequence of identifying a potential alignment point, evaluating that decision and the data used to make that decision, and correcting the data is applied. These are some examples and are not exhaustive.

In some embodiments, the icnt value is calculated instead of employing a counter. An icnt counter runs at $\frac{1}{4}^{th}$ the input signal frequency and may be difficult to achieve at high frequencies or consume a lot of power. icnt can be found either through estimating with a priori knowledge or observation. Suppose both the input signal frequency, ifreq, and the period of interest in units of time, T, are both known and accurate. For example, a crystal oscillator generates the start of period and end of period and ifreq is from a steady source such as a stable VCO. icnt over the time T is approximately equal to $\frac{1}{4}^{th}$ the input signal frequency since icnt increments with each rising edge of IS I. An estimate of icnt, iest, over the time T is therefore:

$$iest \approx ifreq/4*T \qquad \text{Equation 10}$$

Another method to obtain iest is to average the number of ifreq/4 cycles over multiple periods of T if either ifreq or T is unknown. For example, a VCO generating ifreq is not in a steady state and ifreq is unknown. Equation 10 would not be useful in this case and obtaining an estimate of icnt through averaging would be more accurate. Preferably, it is an average of 3 or more samples. In either case, a counter would not have to be employed to obtain the value of icnt and the estimate is preferably accurate within approximately +0.4. $\Delta$icnt can be derived to use iest and is:

$$\Delta icnt = \text{Round}(iest - \Delta rstamp/(4*TDM)) \qquad \text{Equation 11}$$

$\Delta$icnt is an integer value and is therefore rounded. With Equations 8, 9 and 11, the period may be calculated without employing a counter for input subsignal IS1.

In some embodiments, the time it takes for alignment to occur may be reduced by starting the reference subsignals at different phases. If a reference subsignal other than RS1 is started phase synchronous to the beginning or end of the period, it may take less time for alignment to occur. This reduction in time may save power and reduce the effect of error from the reference subsignal frequency. The circuit used to generate the reference subsignals should be designed so it can start oscillating at different phase offsets. The equations to calculate the period $\Delta$timestamp are also modified.

In some embodiments, lower and upper bounds are set on the time it takes for alignment to occur. The bounds are used to ignore and recover from errors in some cases. The output of reference subsignal counter 614 in FIG. 6A is compared to some lower bound and so data from an erroneous alignment that occurred earlier than expected is ignored. An upper bound check may be applied at the same point. If an alignment is not detected by the upper bound limit, the ring oscillator is stopped and other logic reset to wait for the next time a measurement is determined. The upper and lower bounds are selected with sufficient margin. If the period, input frequency and reference frequency are known and accurate values, the time it takes for alignment to occur may be predicted. Some margin could be added to this to get the upper bound and subtracted to obtain the lower bound. This improvement may be useful in a frequency locked loop application before a steady state is reached and the VCO frequency is unstable.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing an input signal having an input signal phase including:
   determining a number of transitions of the input signal within a period having a start and an end; and
   determining a relative beginning phase of the input signal at the start of the period including:
   generating a first reference signal having a first reference signal frequency and a first reference signal phase synchronized with the start of the period; and
   detecting a first time interval required for the input signal phase to have a first specified relationship to the first reference signal phase;
   determining a relative ending phase of the input signal at the end of the period including:
   generating a second reference signal having a second reference signal frequency and a second reference signal phase synchronized with the end of the period; and
   detecting a second time interval required for the input signal phase to have a second specified relationship to the second reference signal phase;
   determining an input signal temporal characteristic from the number of transitions and the relative beginning phase and the relative ending phase.

2. A method as recited in claim 1 wherein the temporal characteristic is the period of the input signal.

3. A method as recited in claim 1 wherein the temporal characteristic is the frequency of the input signal.

4. A method as recited in claim 1 wherein the first reference signal phase is offset from the start of the period.

5. A method as recited in claim 1, further including using the frequency determination in a frequency-locked loop.

6. A method as recited in claim 1, further including using the frequency determination in a phase-locked loop.

7. A method as recited in claim 1, wherein detection of the first interval includes:
   obtaining a plurality of samples of the input signal at a plurality of times relative to the first reference signal; and
   selecting a sample corresponding to the input signal phase having a specified relationship to the first reference signal.

8. A method as recited in claim 1, further including obtaining a sample of the input signal at a plurality of times using one or more flip flops.

9. A method as recited in claim 1, wherein detection of the first interval includes:
   obtaining a plurality of samples of the input signal at a plurality of times relative to the first reference signal; and
   selecting a sample corresponding to the input signal phase having a specified relationship to the first reference signal, wherein a change in the value of samples indicates the sample to be selected.

10. A method as recited in claim 1, wherein detection of the first interval includes:
    obtaining a plurality of samples of the input signal at a plurality of times relative to the first reference signal; and selecting a sample corresponding to the input signal phase having a specified relationship to the first reference signal, wherein a change in the value of samples indicates the sample to be selected, including:
examining the group of samples of the input signal for error; and
correcting the group of samples of the input signal for error.

11. A method as recited in claim 1, wherein detection of the first interval includes:
obtaining a plurality of samples of the input signal at a plurality of times relative to the first reference signal; and
selecting a sample corresponding to the input signal phase having a specified relationship to the first reference signal, wherein a change in the value of samples indicates the sample to be selected and the plurality of samples of the input signal are filtered in a manner that is robust to error.

12. A method as recited in claim 1, wherein the first reference signal includes a plurality of first reference subsignals shifted in phase with respect to each other.

13. A method as recited in claim 1, wherein the input signal includes a plurality of input subsignals shifted in phase with respect to each other.

14. A method as recited in claim 1, wherein the first reference signal includes a plurality of first reference subsignals shifted in phase with respect to each other generated by a ring oscillator.

15. A method as recited in claim 1, wherein the first reference signal includes a plurality of first reference subsignals shifted in phase with respect to each other generated with tunable delay elements.

16. A method as recited in claim 1, wherein the input signal includes a plurality of input subsignals shifted in phase with respect to each other generated by a Johnson Counter.

17. A method as recited in claim 1, wherein an estimated value is used for the number of transitions of the input signal within a period having a start and an end.

18. A method as recited in claim 1, wherein:
the first reference signal includes a plurality of first reference subsignals shifted in phase with respect to each other; and
the first reference signal has a variable phase relationship with the first reference subsignals.

19. A method as recited in claim 1, further including:
the first reference signal includes a plurality of first reference subsignals shifted in phase with respect to each other;
the input signal includes a plurality of input subsignals shifted in phase with respect to each other; and
a subset of all combinations of first reference subsignals and input subsignals is used.

20. A method as recited in claim 1, further including:
determining a relative number of beginning input signal cycles at the beginning of the period;
determining a relative number of ending input signal cycles at the end of the period; and
determining the number of input signal cycles within the period by subtracting the beginning input signal cycles from the ending input signal cycles.

21. A method as recited in claim 1, further including:
determining the number of input signal cycles within the period by adding the number of transitions of the input signal and the relative ending phase of the input signal, and subtracting the relative beginning phase of the input signal.

22. A system for processing an input signal having an input signal phase including:
a processor configured to:
determine a number of transitions of the input signal within a period having a start and an end;
determine a relative beginning phase of the input signal at the start of the period;
determine a relative ending phase of the input signal at the end of the period; and
determine an input signal temporal characteristic from the number of transitions and the relative beginning phase and the relative ending phase;
a reference signal generator configured to generate a reference signal having a reference signal frequency and a reference signal phase synchronized with the start of the period; and
a detector configured to detect a time interval required for the input signal phase to have a specified relationship to the reference signal phase;
wherein the reference signal generator and the detector are used to determine either the relative beginning phase or the relative ending phase or both the relative beginning phase and the relative ending phase.

23. A system as recited in claim 22, wherein the temporal characteristic is the period of the input signal.

24. A system as recited in claim 22, wherein the temporal characteristic is the frequency of the input signal.

25. A system as recited in claim 22, wherein the reference signal phase is offset from the start of the period.

26. A system as recited in claim 22, wherein the system is used in a frequency-locked loop.

27. A system as recited in claim 22, wherein the system is used in a phase-locked loop.

28. A system as recited in claim 22, wherein the detector is further configured to:
obtain a plurality of samples of the input signal at a plurality of times relative to the reference signal; and
select a sample corresponding to the input signal phase having a specified relationship to the reference signal.

29. A system as recited in claim 22, wherein the detector is further configured to obtain a sample of the input signal at a plurality of times using one or more flip flops.

30. A system as recited in claim 22, wherein the detector is further configured to:
obtain a plurality of samples of the input signal at a plurality of times relative to the reference signal; and
select a sample corresponding to the input signal phase having a specified relationship to the reference signal, wherein a change in the value of samples indicates the sample to be selected.

31. A system as recited in claim 22, wherein the detector is further configured to:
obtain a plurality of samples of the input signal at a plurality of times relative to the reference signal; and
select a sample corresponding to the input signal phase having a specified relationship to the reference signal, wherein a change in the value of samples indicates the sample to be selected, including:
examine the group of samples of the input signal for error; and
correct the group of samples of the input signal for error.

32. A system as recited in claim 22, wherein the detector is further configured to: obtain a plurality of samples of the input signal at a plurality of times relative to the reference signal; and select a sample corresponding to the input signal phase having a specified relationship to the reference signal, wherein a change in the value of samples indicates the sample to be selected and the plurality of samples of the input signal are filtered in a manner that is robust to error.

33. A system as recited in claim 22, wherein the reference signal generator is further configured such that the reference signal includes a plurality of reference subsignals shifted in phase with respect to each other.

34. A system as recited in claim 22, wherein the input signal includes a plurality of input subsignals shifted in phase with respect to each other.

35. A system as recited in claim 22, wherein the reference signal generator is further configured such that the reference signal includes a plurality of reference subsignals shifted in phase with respect to each other and are generated by a ring oscillator.

36. A system as recited in claim 22, wherein the reference signal generator is further configured such that the reference signal includes a plurality of reference subsignals shifted in phase with respect to each other and are generated with tunable delay elements.

37. A system as recited in claim 22, wherein the input signal includes a plurality of input subsignals shifted in phase with respect to each other generated by a Johnson Counter.

38. A system as recited in claim 22, wherein the processor is further configured to use an estimated value for the number of transitions of the input signal within a period having a start and an end.

39. A system as recited in claim 22, wherein the reference signal generator is further configured such that:

the reference signal includes a plurality of reference subsignals shifted in phase with respect to each other; and the reference signal has a variable phase relationship with the reference sub signals.

40. A system as recited in claim 22, wherein the reference signal generator is further configured such that:

the reference signal includes a plurality of reference subsignals shifted in phase with respect to each other; and the input signal includes a plurality of input subsignals shifted in phase with respect to each other; and the detector is further configured such that a subset of all combinations of reference subsignals and input subsignals is used.

41. A system as recited in claim 22, wherein the processor is further configured to:

determine a relative number of beginning input signal cycles at the beginning of the period;

determine a relative number of ending input signal cycles at the end of the period; and determine the number of input signal cycles within the period by subtracting the beginning input signal cycles from the ending input signal cycles.

42. A system as recited in claim 22, wherein the processor is further configured to:

determine the number of input signal cycles within the period by adding the number of transitions of the input signal and the relative ending phase of the input signal, and subtracting the relative beginning phase of the input signal.

* * * * *